Dec. 13, 1966

A. E. WOLFRAM 3,292,089

UHF CONVERTER CIRCUIT ARRANGEMENT

Filed Dec. 31, 1962

INVENTOR:
ADOLF E. WOLFRAM,

BY Frank J. Thompson
HIS ATTORNEY.

3,292,089

UHF CONVERTER CIRCUIT ARRANGEMENT

Adolf Earnest Wolfram, Jamesville, N.Y., assignor to General Electric Company, a corporation of New York
Filed Dec. 31, 1962, Ser. No. 248,522
1 Claim. (Cl. 325—449)

This invention relates to converter circuit arrangements for tuning RF signal frequencies in an Ultra High Frequency band and for converting the tuned signal frequencies to a desired intermediate frequency. The invention relates more particularly to improvements in UHF converter circuit arrangements.

UHF converter circuit arrangements of the type utilizing radio frequency selective input circuits, a local oscillator, and a mixer circuit for heterodyning a received radio frequency and a locally produced oscillator signal to generate an intermediate frequency signal exhibit an undesirable attenuation in the amplitude of the intermediate frequency signal when relatively higher frequencies in a UHF frequency band are tuned. This attenuation is attributed to a decrease in the Q of the input tuned circuits as the higher frequencies in the band are selected. A decreasing Q effectively represents an increased loading on the tuned circuits thereby causing a reduction in the amplitude of an RF signal voltage which is injected into the mixer circuit. The decreasing RF input voltage consequently reduces the conversion efficiency of the UHF converter and causes an undesirable fall-off in amplitude of the output intermediate frequency signal.

Accordingly, an object of the present invention is to provide an improved UHF converter circuit arrangement.

Another object of the present invention is to provide a UHF converter circuit arrangement for generating an output intermediate frequency signal of relatively uniform amplitude over a range of relatively higher RF frequencies being tuned.

A further object of the present invention is to provide a UHF converter circuit arrangement having means for reducing the effective loading on input tuned circuits.

Still another object of this invention is to provide a converter circuit arrangement having means for compensating for variations in the Q of input tuned circuits when these circuits are adjusted to selectively tune differing frequencies in the UHF frequency band.

In accordance with the present invention, a UHF frequency converter circuit arrangement is provided including an input network for tuning RF signal voltages in the UHF band, a mixer network and a local oscillator network. Circuit means are provided for effectively varying with frequency a dynamic impedance which is reflected into the input tuned circuit network from the mixer circuit for compensating for variations in the Q of the tune circuits over the UHF tuning range.

Figure 1:
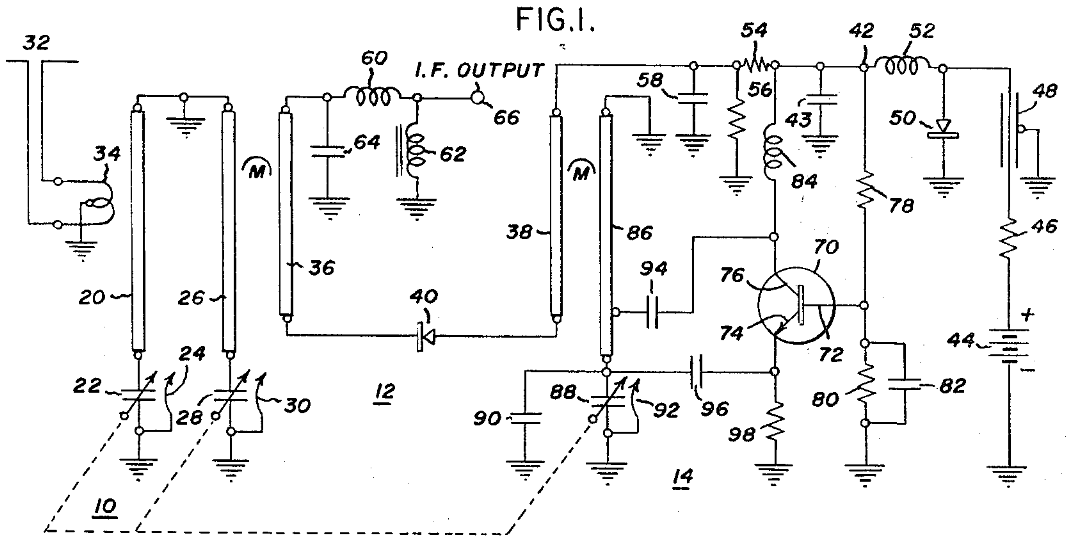
Figure 2:
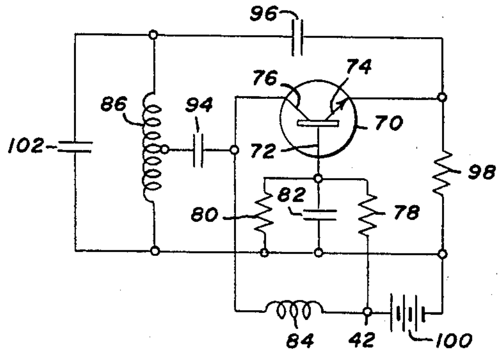
Figure 3:
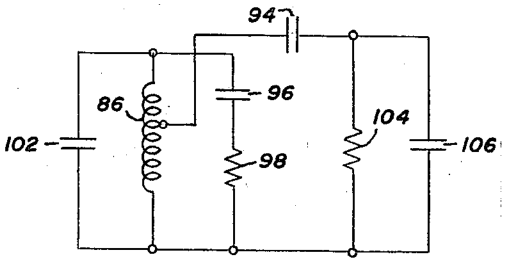
Figure 4:
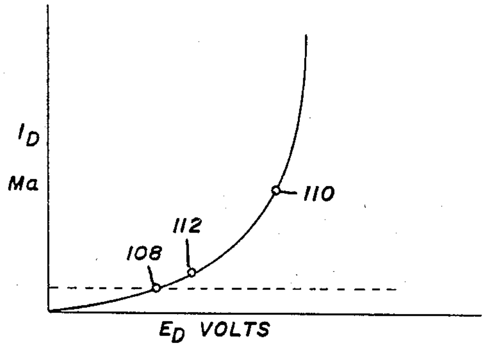

Further objects, features and the attending advantages of the invention will be apparent with reference to the following specifications and drawings in which:

FIGURE 1 is a diagram of a UHF converter circuit arrangement embodying the present invention, FIGURE 2 is a circuit diagram of a local oscillator utilized in the circuit arrangement of FIGURE 1, FIGURE 3 is an equivalent circuit diagram of the local oscillator of FIGURE 2, and FIGURE 4 is a characteristic curve of a diode mixer element utilized in the circuit arrangement of FIGURE 1.

Referring now to FIGURE 1, a UHF converter circuit arrangement suitable for converting a received RF signal in a UHF band to a desired intermediate frequency is shown. Although the converter of FIGURE 1 is particularly adaptable for converting RF signals in the presently utilized UHF television band, 470 mc.–890 mc., to an intermediate frequency for use in television receivers, the invention as described hereinafter can advantageously be employed in other systems as will be apparent to those skilled in the art. The converter circuit arrangement comprises an input tuning network, a mixer network, and an oscillator network indicated respectively as 10, 12, and 14.

Input tuning network 10 comprises a double tuned circuit including a first transmission line 20 which is shorted at one end and which is capacitively tuned by a first variable capacitor 28 and a trimmer capacitor 24 and a second transmission line 26 similarly shorted at one end and capacitively tuned by variable and trimmer capacitors 28 and 30 respectively. A transmitted RF signal in the UHF band is induced in an antenna 32 and directly coupled via a center tapped coupling inductance 34 to the line 20 and by mutual inductance thereafter to the line 26 and to an inductance 36 of the mixer circuit 12. The components of the input tuning network 10 are arranged for providing a required bandwidth for a desired application. When the converter is utilized as a tuner for television signals, the desired bandwidth is on the order of 6 mc.

In addition to the inductance 36, the mixer network 12 includes an inductance 38 for coupling a locally generated oscillation from the oscillator network 14 to a diode mixing element 40. The received RF voltage and the generated oscillator voltages are heterodyned by the diode to provide a difference frequency equal to an intermediate frequency which is utilized in a utility circuit or apparatus, as for example a television receiver.

For satisfactory conversion efficiency and low distortion in the output signal, it has been found advantageous to provide a residual forward bias current flow, $i_d$, in the diode 40. To this end, and for additionally providing an operating voltage for the oscillator circuit 14, a power supply arrangement is provided for establishing a D.C. operating potential at a junction 42 of the converter circuit arrangement. D.C. potential is coupled to the junction 42 from a source 44 via a current limiting resistor 46, a capacitor 48 which is indicated symbollically as being of the chassis feed-through type, a Zener diode 50 and an inductance 52. The D.C. potential source 44, resistor 46, and diode 50 establish an operating voltage at junction point 42 which is on the order of 10–20 volts. A capacitor 43 is provided for by-passing radio frequency voltages at junction 42 to ground. The reverse voltage breakdown characteristic of the Zener diode is selected to establish and regulate the desired voltage. Feed-through capacitor 48 and the inductor 52 also constitute an LC filter for blocking alternating signals of radio and oscillator frequencies from being radiated or coupled from the chassis of the converter circuit arrangement to points external to the chassis via the power supply leads. The D.C. voltage established at point 42 is attenuated by a voltage divider comprising resistors 54 and 56. These resistors provide a desired bias voltage at the junction thereof for establishing a residual forward bias current $i$ in the diode 40. Capacitor 58 is a by-pass capacitor for radio frequency and intermediate frequency signals. A D.C. return path for the current $i_d$ is provided by inductance 60 and choke 62 in the mixer circuit 12. Capacitor 64 by-passes radio frequency and oscillator frequencies to ground while presenting a relatively high impedance to the generated intermediate frequency. An intermediate frequency signal which is generated in the mixer circuit is coupled via the inductance 60 and output terminal 66 to a utility circuit, not shown. In addition to providing a relatively high impedance to frequencies above the intermediate frequency, the inductance 60 may also comprise a portion of an intermediate frequency tuning circuit which may be included in an input circuit of an associated VHF tuner when, for example a television receiver comprises the utility apparatus for the generated intermediate frequency voltage.

The oscillator network 14 comprises a transistor amplifying device 70 having base 72, emitter 74 and collector 76 electrode. D.C. operating potential is established at the base electrode 72 by a voltage divider coupled between junction 42 and ground potential and comprising resistors 78 and 80 and a by-pass capacitor 82. Collector electrode operating potential is coupled from junction 42 to the collector electrode via a choke 84. A tuned circuit for adjusting the frequency of oscillation of the oscillator network 14 comprises a transmission line 86 which is shorted at one end and which is tuned by variable capacitor 88, temperature compensating capacitor 90, and a trimmer capacitor 92. The collector electrode 76 is coupled to the line 86 by a capacitor 94. A capacitor 96, discussed more fully hereinafter, couples the emitter electrode 74 to one end of the line. Resistor 98, in addition to providing a function described more fully hereinafter, also acts as a collector current limiting resistor.

In operation, a UHF radio frequency signal is tuned by the tuned network 10 and coupled into the mixer circuit. Capacitors 22, 28 and 88 are gang tuned and the oscillator circuit is simultaneously adjusted to generate an oscillation signal which when heterodyned with the tuned RF signal in the mixer network 10 generates a desired IF output signal at terminal 66.

As indicated hereinbefore, the Q of the double tuned circuits of network 10 decrease when the relatively higher UHF frequencies are tuned. In accordance with a feature of the present invention, circuit means comprising capacitor 96 and resistor 98 are provided and arranged in a manner for effectively compensating for this decrease in Q to provide a relatively uniform IF output voltage when the relatively higher UHF frequencies are tuned.

For a more detailed explanation of the features of the present invention reference is now made to FIGURES 2, 3, and 4. In FIGURE 2 the oscillator network 14 of FIGURE 1 is separately illustrated and similar elements are represented by the same numerals. For simplification in the drawing of FIGURE 2, the elements 46, 48 and 50 have been omitted and a voltage source 100 is shown for providing the voltage available at junction 42 of FIGURE 1. Capacitor 102 represents the sum of capacitors 88, 90 and 92. The equivalent A.C. circuit of FIGURE 2 is illustrated in FIGURE 3. A generated oscillation will exist across the tank circuit comprising the transmission line 86, which is represented as an inductance in FIGURES 2 and 3, and the capacitor 102. As indicated previously, the generated oscillation is inductively coupled into the mixer circuit for heterodyning with the RF voltage. The mixer circuit diode 40 is forward biased and conducts a residual current $i_d$ as indicated at point 108 in FIGURE 4. At the lower RF frequencies which are being tuned, the Q of the tuned circuits is relatively high and a relatively large RF signal is injected into the mixer circuit. It is generally desirable to heterodyne an oscillator signal of greater magnitude with an RF signal of lesser amplitude. Further, the oscillation signal which is injected into the mixer circuit is rectified and a D.C. component of current is added to the residual current $i_d$. At the relatively lower RF frequencies being tuned, the sum of the D.C. currents flowing in the diode is indicated for example as point 110 in FIGURE 4. This point on the curve represents an operating point of relatively low dynamic impedance. Since inductive coupling exists between line 26 and inductance 36, this dynamic impedance is reflected into the tuned circuit network 10 and is significant in establishing the value of Q of the tuned circuit. As the higher RF frequencies are tuned, the Q of the tuned circuits decrease whereas the dynamic impedance of point 112 remains relatively unchanged. Thus, the ratio of oscillator to RF injection voltages becomes excessive, the conversion efficiency decreases, and the generated IF signal is attenuated.

In accordance with a feature of this invention, the operating point along the $i_d$-$E_D$ curve of FIGURE 4 is caused to move automatically into a region of higher dynamic impedance, as for example to point 112, when the relatively higher RF frequencies are tuned. The higher dynamic impedance effectively "unloads" the tuned circuit and provides higher RF injection signal amplitudes at the higher frequencies. For providing this desirable result, the capacitor 96 and resistor 98 are coupled for alternating currents in shunt with the tank circuit as indicated in FIGURE 3. As higher RF frequencies are tuned, a higher oscillator frequency will simultaneously be tuned. Since capacitor 96 provides a decreasing impedance with increasing frequency, the tank circuit comprising capacitance 102 and inductance 86 will be loaded and the oscillator injection voltage which is coupled into the mixer circuit will be attenuated. A lowered oscillator injection voltage provides a D.C. component of less magnitude than initially provided, as for example at point 112 on the curve of FIGURE 4. The operating point will accordingly move to a point of higher dynamic impedance as desired, the Q of the tuned circuits will be maintained relatively constant, and a uniform amplitude IF signal will be generated.

While it will be understood that the value of circuit components for the converter circuit may vary in order to satisfy desired requirements, the following circuit parameters have been found to provide satisfactory operation for tuning RF signals within the 470 mc. to 890 mc. UHF band:

| | |
|---|---|
| Amplifying device **70** | Fairchild transistor TD 1211. |
| Capacitors: | |
| **22** | variable 2–8 pico-farad. |
| **28** | variable 2–8 pico-farad. |
| **88** | variable 3–14 pico-farad. |
| Capacitors: | |
| **90** | .66 pico-farad. |
| **64** | 27 pico-farad. |
| **58** | .001 micro-farad. |
| **43** | 27 pico-farad. |
| **48** | .001 micro-farad. |
| **82** | 27 pico-farad. |
| **94** | 15 pico-farad. |
| **96** | .15 pico-farad. |
| **24, 30, 92** Trimmer tabs | .4 pico-farad. |
| Inductance: | |
| **20, 26** | transmission line, 15 nano-henry. |
| **86** | transmission line, 7 nano-henry. |
| **36** | 20 nano-henry. |
| **38** | 6 nano-henry. |
| **60** | .3 micro-henry. |
| **62** | 5 micro-henry. |
| **84** | .4 micro-henry. |
| **52** | .4 micro-henry. |
| Resistors: | |
| **54** | 9100 ohms. |
| **56** | 180 ohms. |
| **98** | 330 ohms. |
| **78** | 10,000 ohms. |
| **80** | 2700 ohms. |
| **46** | 12,000 ohms (for 140 v. source 44). |
| D.C. potential **44** | 140 volts, minimum value 10 v. |

While I have illustrated and described and have pointed out in the annexed claims certain novel features of my invention, it will be understood that various omissions, substitutions and changes in the forms and details of the system illustrated may be made by those skilled in the art without departing from the spirit of the invention and the scope of the claim.

What I claim as new and desire to secure by Letters Patent is:

A converter circuit comprising: a frequency selective input network for tuning a radio frequency signal in a UHF frequency band; an oscillator network for generating a high frequency alternating signal; a mixer network for heterodyning two input signals to produce an output difference frequency signal, said mixer network including a diode mixing element, said diode having a diode current versus diode voltage curve including segments thereon of relatively higher and lower dynamic impedance; said input network, said oscillator network and said mixer network arranged for coupling a tuned radio frequency signal and oscillator alternating signal into the mixer network for producing a difference frequency signal thereof; and frequency responsive means for causing said diode to exhibit a relatively higher dynamic impedance when relatively higher UHF frequencies are tuned.

References Cited by the Examiner

UNITED STATES PATENTS

| | | | |
|---|---|---|---|
| 2,001,695 | 5/1935 | Farnham ---------- | 325—438 |
| 2,095,035 | 10/1937 | Posthumus et al. ---- | 325—438 |
| 2,626,354 | 1/1953 | Cheek ------------- | 331—182 |
| 2,843,746 | 7/1958 | Hofker ------------ | 331—183 |

KATHLEEN H. CLAFFY, *Primary Examiner.*

DAVID G. REDINBAUGH, *Examiner.*

E. C. MULCAHY, R. S. BELL, *Assistant Examiners.*